(12) United States Patent
Hackl

(10) Patent No.: US 9,929,558 B2
(45) Date of Patent: Mar. 27, 2018

(54) ELECTRICAL PROTECTIVE DEVICE AND METHOD FOR SELECTIVE DISCONNECTION OF A SUBSYSTEM IN CASE OF A SECOND FAULT IN AN IT POWER SUPPLY SYSTEM

(71) Applicant: Bender GmbH & Co. KG, Gruenberg (DE)

(72) Inventor: Dieter Hackl, Fernwald (DE)

(73) Assignee: Bender GmbH & Co. KG, Gruenberg (DE)

( * ) Notice: Subject to any disclaimer, the term of this patent is extended or adjusted under 35 U.S.C. 154(b) by 207 days.

(21) Appl. No.: 14/940,866

(22) Filed: Nov. 13, 2015

(65) Prior Publication Data

US 2016/0141860 A1    May 19, 2016

(30) Foreign Application Priority Data

Nov. 14, 2014    (DE) .................. 10 2014 223 287

(51) Int. Cl.
*H02H 3/00* (2006.01)
*H02H 3/34* (2006.01)
*H02H 3/17* (2006.01)
*G01R 31/08* (2006.01)
*H02H 1/00* (2006.01)
*H02H 7/28* (2006.01)

(52) U.S. Cl.
CPC .............. *H02H 3/34* (2013.01); *H02H 3/17* (2013.01); *G01R 31/086* (2013.01); *H02H 1/003* (2013.01); *H02H 7/28* (2013.01); *Y04S 10/522* (2013.01)

(58) Field of Classification Search
USPC ............................................. 361/42, 62–69
See application file for complete search history.

(56) References Cited

U.S. PATENT DOCUMENTS

| 2010/0149700 A1* | 6/2010 | Hastings | H02H 7/30 361/42 |
| 2011/0075304 A1* | 3/2011 | Hamer | H02H 7/263 361/47 |

FOREIGN PATENT DOCUMENTS

| DE | 4317270 A1 | 1/1994 |
| DE | 69007857 T2 | 9/1994 |
| DE | 102013218836 A1 | 3/2015 |

* cited by examiner

*Primary Examiner* — Danny Nguyen
(74) *Attorney, Agent, or Firm* — King & Schickli, PLLC

(57) ABSTRACT

An electrical protective device (20) and method are for selective disconnection of a subsystem (6a, 6b) in the event of a second fault in an ungrounded power supply system (2) with a main system (4) and at least one subsystem (6a, 6b), the subsystem (6a, 6b) having a differential current measuring device (12a, 12b) and a switching device (14a, 14b) for separating the subsystem (6a, 6b). The invention is based on generating and applying a measuring signal voltage ($U_m$) between one or more phase(s) of the main system (4) or from a neutral point of the main system (4) against ground (9) using a resonant coupling circuit (22) that has a measuring signal generator (24) and a series resonant circuit (26) connected in series to the measuring signal generator (24), a resonant frequency ($f_{oAK}$) of the series resonant circuit (26) being set to correspond to the measuring signal frequency.

15 Claims, 3 Drawing Sheets

(State of the art)

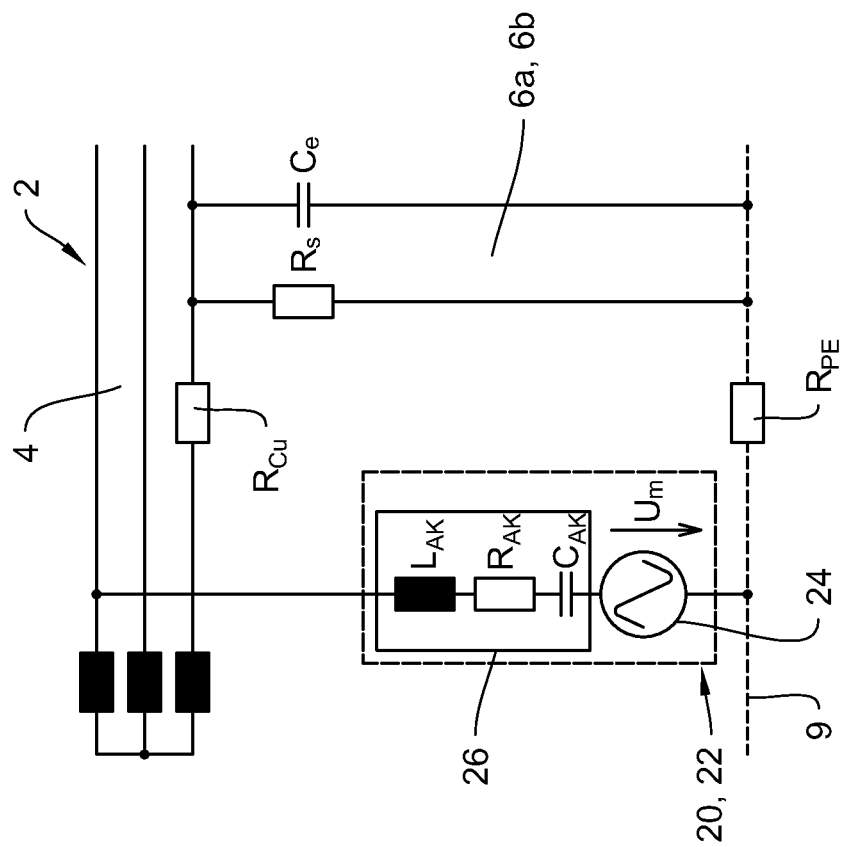

Figure 1:
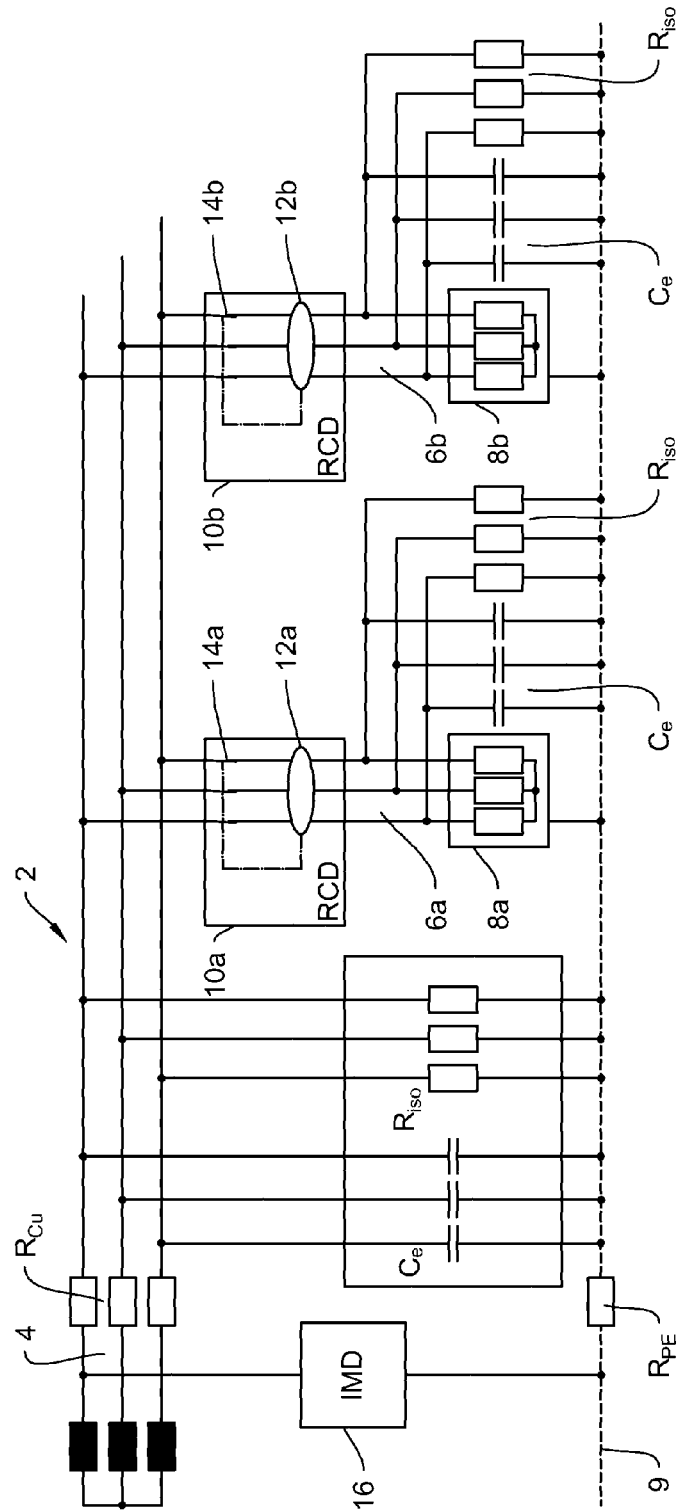

ELECTRICAL PROTECTIVE DEVICE AND METHOD FOR SELECTIVE DISCONNECTION OF A SUBSYSTEM IN CASE OF A SECOND FAULT IN AN IT POWER SUPPLY SYSTEM

This application claims the benefit of German patent application 10 2014 223 287.2, the disclosure of which is incorporated herein by reference.

TECHNICAL FIELD

The invention relates to an electrical protective device and to a method for selective disconnection of a subsystem in the event of a second fault in an ungrounded power supply system (IT power supply system—insulated or ungrounded power supply network) that consists of a main system and at least one subsystem, said subsystem having a differential current measuring device and a switching device for separating the subsystem.

The system type of an IT power supply system is used to supply electrical equipment in case of increased requirements in terms of operational, fire and contact safety. In this type of power supply system, the active parts of the electrical installation are separated from the ground potential, i.e. from "ground". The advantage of these systems is that in case of a first insulation fault, such as a ground fault or a fault to frame, the function of the electrical equipment is not affected because no closed circuit can form in said first fault case because of the ideally infinitely high impedance value between the conductor and ground.

Owing to the inherent safety of the IT power supply system, a continuous power supply of the loads fed by the IT power supply system, i.e. of the equipment connected to the IT power supply system, can thus be ensured even if a first insulation fault occurs.

Hence, the resistance of the IT power supply system against ground (insulation resistance, also insulation fault resistance or fault resistance in the fault case) is permanently monitored because a potential additional fault on one of the other active conductors (second fault) would result in a fault loop, and the fault current that would flow in that case, in connection with an overcurrent protective device, would result in a disconnection of the installation including a stop in operation.

Under the condition that the state of insulation of the IT power supply system is continuously monitored by an insulation monitoring device, the IT power supply system can thus also continue to be operated without a prescribed time limit in case of a first fault. In the event of the second fault, the protective measure "automatic disconnection" is required if no additional protective provisions are in place.

However, the reliable detection of a second, in particular high-resistance, fault of non-negligible impedance poses a problem that has not been solved in a satisfactory manner so far. An undetected high-resistance fault may result in unreliable overcurrent tripping, while danger from electrical shock and/or a fire hazard is still very likely.

High symmetric system leakage capacitances and/or symmetric insulation faults present in an extensive IT power supply system may potentially generate a differential current even without a second asymmetric (insulation) fault; said differential current, however, is too low to trip the residual-current devices (RCDs). An asymmetric second insulation fault occurring now would cancel the symmetry of the present system leakage capacitances and/or of the present insulation faults so that suddenly all residual current devices (RCDs) of the IT power supply system experience a differential current, which will thus trip the RCDs and also disconnect the subsystems that are not affected by a second fault.

According to the state of the art, this problem has been addressed by the use of direction-selective residual-current monitoring devices (RCMs) in extensive IT power supply systems.

The functional principle of a directionally selective residual current monitoring device (RCM) is to perform a phase evaluation of the measured differential current via an artificially created reference neutral point in such a manner that only the fault current that flows in the direction of the load can cause tripping and not the fault current that flows in the direction of the feeding point.

For the directionally selective detection to work reliably, certain conditions have to be met. One important requirement to be observed demands that the system-side system leakage capacitances ("upstream" of the respective differential current measuring device) are several times larger than the load-side system leakage capacitances ("downstream" of the respective differential current measuring device).

According to the product standard for residual current monitoring devices (RCMs) for household installations and similar uses, DIN EN 62020 (VDE 0663):2005-11, a ratio of 6:1 is required for the system leakage capacitances on the system side and on the load side.

Compliance with this requirement entails considerable technical effort both for the constructor and for the operator of the electrical installation. In practice, compliance with this requirement necessary for the reliable operation of an electrical protective device cannot be safely ensured under all operating conditions and over the entire lifespan of the electrical installation.

The substantial disadvantages of known protective devices thus lie in the fact that, on the one hand, detection of a second fault, in particular of a high-resistance fault, is not reliably ensured and, on the other hand, a second fault, if detected, may result in disconnection of the entire IT power supply system. However, in extensive IT power supply systems, disconnection of the main system including all subsystems, i.e. of non-faulty subsystems as well, leads to interruptions in operation that should have been avoided by the installation of the system type of an IT power supply system in the first place.

Therefore, the object of the present invention is to propose an electrical protective device and a method that reliably ensure detection of a second fault occurring in an ungrounded power supply system that consists of a main system and at least one subsystem and allow selective disconnection of the faulty subsystem(s).

SUMMARY

This object is attained by an electrical protective device that consists of a resonant coupling circuit that is connected against ground from one or more phase(s) of the main system or from a neutral point of the main system and has a measuring signal generator for generating a measuring signal voltage that has a measuring signal frequency and a series resonant circuit that is connected in series to the measuring signal generator and has a capacity, an inductivity and an ohmic resistance.

The basic idea of the present invention is based on the fact that in the event of a second fault, a low-resistance return path for the fault current is provided for an applied measuring signal in a narrow-band frequency range that is tuned to a measuring signal frequency of the measuring signal.

According to the invention, the low-resistance return path is formed by a resonant coupling circuit that has a measuring signal generator and a series resonant circuit connected in series to the measuring signal generator.

Thus, in the event of a second fault, a closed circuit can form in which the measuring current driven by the measuring signal generator flows as a fault current largely independently of the distribution of the system leakage capacitances through the resonant coupling circuit and only through the differential current measuring device that is arranged in the subsystem in which the second fault has occurred. The fault current, which has the same frequency as the measuring signal and can be detected via the differential current measuring device, can be used to specifically disconnect the faulty subsystem.

In this embodiment, a separating device of the subsystem previously installed therein is co-utilized. Most commonly, said separating device is a switching device within a present residual current device (RCD). In this embodiment of the protective device according to the invention, the switching device as well as the differential current measuring device already present in the subsystem is not part of the protective device according to the invention.

In an advantageous embodiment, the capacitance and the inductivity of the series resonant circuit are realized in such a manner that a resonant frequency of the series resonant circuit corresponds to the measuring signal frequency of the measuring signal voltage.

The total resistance of the series resonant circuit is determined only by the ohmic resistance in case of the resonant frequency. If the elements of the series resonant circuit that determine the resonant frequency, i.e. the capacitance and the inductivity, are realized in such a manner that the resonant frequency is equal to the measuring signal frequency, the resonant coupling circuit forms a low-resistance return path having the ohmic resistance of the series resonant circuit, via which the measuring circuit that forms because of the second fault closes.

Furthermore, the capacitance and the inductivity of the series resonant circuit are realized in such a manner that the resonant frequency of the series resonant circuit is sufficiently different from an insulation resistance measuring frequency of an insulation monitoring device that is arranged in the power supply system and sufficiently different from a supply frequency of the power supply system.

Based on the fact that most IT power supply systems are equipped with an insulation monitoring device (IMD), the capacitance and the inductivity of the series resonant circuit are selected in such a manner that the resonant frequency of the series resonant circuit is sufficiently different from an (insulation resistance) measuring frequency that is used in the insulation monitoring device (IMD) so that the function of the insulation monitoring device, which is also connected between the IT power supply system and ground, is not disturbed.

A likewise sufficiently large frequency difference between the measuring signal frequency and the supply frequency of the IT power supply system has the advantage that potentially present differential current portions that have the same frequency as the supply system can be suppressed by means of simple filter circuits.

In another embodiment, the capacitance of the series resonant circuit is several times smaller than the sum of the system leakage capacitances present in the IT power supply system.

In this case, a fluctuation of the system leakage capacitances, in particular in extensive IT power supply systems, where the system leakage capacitances can take on high values and thus low impedance values, have a negligible influence on the resonant frequency, which is determined by the several times smaller capacitance and the inductivity of the series resonant circuit.

Advantageously, the ohmic resistance of the series resonant circuit is low enough for the resonant coupling circuit to approximately have a characteristic of an ideal voltage source.

If the ohmic resistance of the series resonant circuit is realized in such a manner, an approximately constant amplitude of the measuring signal voltage against ground can be assumed (ideal voltage source) so that in connection with a portion of the fault current that has the same frequency as the measuring signal and is determined via the differential current measuring device of the faulty subsystem, it is easily possible to calculate the fault resistance in said subsystem.

In another embodiment, the resonant coupling circuit has a control circuit that changes the measuring signal frequency in such a manner that an amplitude of a measuring current that is driven by the measuring signal voltage is at a maximum.

By way of this measure, the influence of the present system leakage capacitances on the resonant frequency of the series resonant circuit is automatically taken into account because the sum of the system leakage capacitances present in the IT power supply system influences the value of the measuring current. The control circuit reacts very slowly with respect to the effect of a suddenly occurring second fault. The measuring signal frequency can thus be adjusted to the already prevailing operating conditions and to the state of insulation of the IT power supply system.

Advantageously, the electrical protective device has a phase comparator that is associated with the differential current measuring device of the subsystem and ascertains a phase of a differential current detected in the differential current measuring device in relation to a phase of the measuring signal voltage.

As another component, the electrical protective device comprises a phase comparator for each subsystem to be monitored so as to allow a differentiation between an ohmic fault current and a capacitive leakage current within the differential current detected in the respective subsystem. The phase comparator may be arranged in the differential current measuring device of the subsystem.

Preferably, the electrical protective device has a communication channel between the resonant coupling circuit and the phase comparator for transmitting the phase of the measuring signal voltage.

For the phase comparator associated with the respective differential current measuring device to be able to evaluate the phase of the differential current, the electrical protective device has a communication channel via which the phase of the measuring signal voltage that is generated by the measuring signal generator is transmitted as a reference phase to the phase comparator.

Furthermore, a secondary coil of a differential current transformer of the differential current measuring device is terminated with a capacitive burden impedance so that in connection with the differential current transformer, which is realized as a Rogowski coil, a parallel resonant circuit is formed that is tuned to the resonant frequency of the series resonant circuit.

In this embodiment of the electrical protective device, the differential current measuring device is part of the protective device. Preferably, a measuring signal frequency is used that is high enough for the differential current measuring device to be realized with a differential current transformer that is configured as a flexible transformer on the basis of a Rogowski coil.

In another embodiment, the electrical protective device has a separating device for separating the subsystem as a functional component.

In contrast to the embodiment according to claim 1, where the switching device of the residual current device already present in the subsystem is co-utilized, the electrical protective device can have a "separate" separating device for each subsystem to be monitored, which is functionally associated with the electrical protective device. The separating device(s) then constitute(s) an integral component of the electrical protective device.

Furthermore, the object is attained by a method that comprises the following method steps: generating a measuring signal voltage that has a measuring signal frequency, applying the measuring signal voltage between one or more phase(s) of the main system or from a neutral point of the main system against ground by means of a resonant coupling circuit that has a measuring signal generator and a series resonant circuit that is connected in series to the measuring signal generator, a resonant frequency of the series resonant circuit being set in such a manner that it corresponds to the measuring signal frequency.

Starting from the problem of reliably detecting the occurrence of a second fault in a subsystem and of being able to selectively disconnect said subsystem, first a measuring signal voltage that has a specific measuring signal frequency is generated by means of a measuring signal generator and applied to the main system of the IT power supply system via a resonant coupling circuit. The resonant frequency of the series resonant circuit is set by means of the resonant frequency-determining elements capacitance and inductivity in such a manner that the resonant frequency corresponds to the measuring signal frequency.

In this way, it is achieved that in the event of a second fault, a low-resistance return path having the ohmic resistance of the series resonant circuit is provided, via which the fault current having the same frequency as the measuring signal, flowing in the faulty subsystem and being driven by the measuring signal generator can form a closed measuring circuit.

Advantageously, the resonant frequency of the series resonant circuit is set in such a manner that is sufficiently different from an (insulation resistance) measuring frequency of an insulation monitoring device that is arranged in the power supply system and sufficiently different from a supply frequency of the power supply system.

In this way, on the one hand, an undisturbed function of the insulation resistance monitoring device is ensured, and on the other hand, common-mode voltages of high amplitude that are to be expected in the IT power supply system are different enough from the resonant frequency so as to not cause high currents through the series resonant circuit.

In another advantageous embodiment, the measuring signal frequency is controlled to change so that an amplitude of a measuring current that is driven by the measuring signal voltage reaches a maximum.

Through control of this kind, the measuring signal frequency is tuned to the resonant frequency of the series resonant circuit while taking into account the influence of the present system leakage capacitances.

Furthermore, a phase comparison is performed, in which a phase of a differential current to be detected in the differential current measuring device is ascertained in relation to a phase of the measuring signal voltage.

Thus, a differentiation between an ohmic fault current and a capacitive leakage current can take place within the differential current detected in the respective subsystem by the differential current measuring device, which in turn prevents the differential current measuring device from being falsely tripped because of an excess capacitive leakage current.

Advantageously, the phase of the measuring signal direct voltage is transmitted from the resonant coupling circuit to a phase comparator.

The phase of the measuring signal voltage generated by the measuring signal generator provides a reference phase for the respective phase comparator associated with the differential current measuring device for evaluating the phase of the differential current.

BRIEF DESCRIPTION OF THE DRAWING FIGURES

Figure 2:
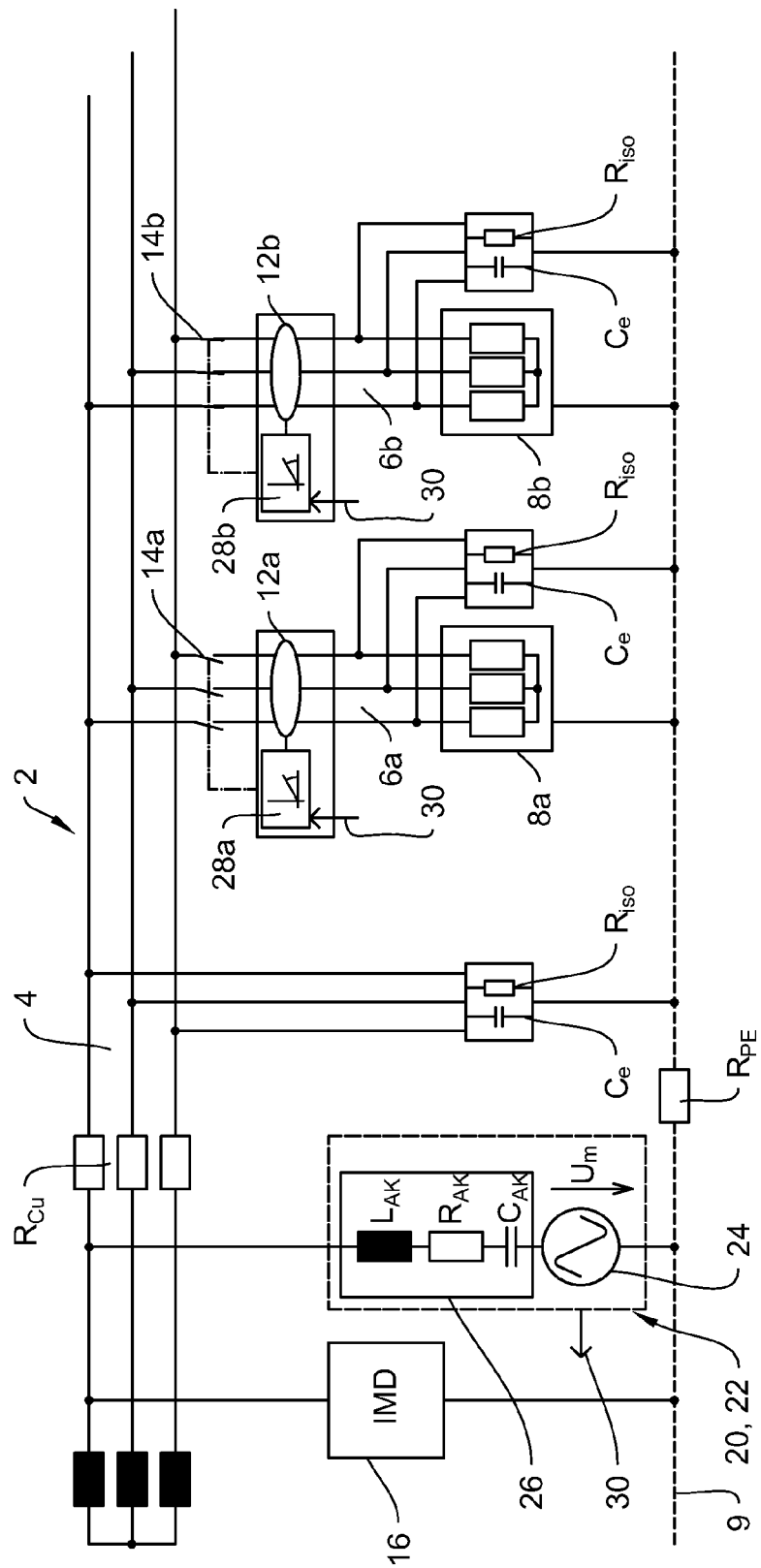

Other advantageous embodiment features become apparent from the following description and from the drawings, which illustrate preferred embodiments of the invention by way of examples. In the figures:

FIG. 1: shows an ungrounded power supply system (IT power supply system) that is monitored according to the state of the art;

FIG. 2: shows an IT power supply system comprising an electrical protective device according to the invention; and FIG. 3: shows a simplified illustration of the IT power supply system that is monitored according to the invention.

DETAILED DESCRIPTION

FIG. 1 shows a 3-phase IT power supply system 2 that is monitored according to the state of the art and consists of a main system 4 and two subsystems 6a, 6b that branch off from the main system 4 as supply branches for connected loads 8a, 8b. Each of the loads 8a, 8b is connected to ground potential/ground 9 via a protective conductor, whose resistance is indicated as $R_{PE}$.

The individual phase conductors of the main system 4 have the conductor resistance $R_{Cu}$. With respect to their (complex-valued) insulation resistances, the main system 4 and the subsystems 6a, 6b are characterized by the system leakage capacitances $C_e$ and by the ohmic insulation resistances $R_{iso}$. A residual current device (RCD) 10a, 10b is provided in each subsystem 6a, 6b, each RCD consisting of a differential current measuring device 12a, 12b and a switching device 14a, 14b for separating the subsystem 6a, 6b. For monitoring of the total insulation resistance of the IT power supply system 2, an insulation monitoring device (IMD) 16 is connected between the main branch 4 and ground 9.

FIG. 2 shows the IT power supply system 2 comprising an embodiment of an electrical protective device 20 according to the invention.

The electrical protective device 20 is realized as a resonant coupling circuit 22, which is connected between a phase of the main system 4 and ground 9 by way of example in FIG. 2. Generally, the resonant coupling circuit 22, similarly to the known insulation monitoring device (IMD) 16, can have a connection between ground 9 and all phases or a neutral point of the IT power supply system 2 to be monitored.

The resonant coupling circuit 22 consists of a measuring signal generator 24 for generating a measuring signal voltage $U_m$ and a series resonant circuit 26 that is connected in series to the measuring signal generator 24 and has an inductivity $L_{AK}$, a capacitance $C_{AK}$ and an ohmic resistance $R_{AK}$.

Furthermore, the electrical protective device 20 comprises one or more phase comparators 28a, 28b that are arranged in the respective differential current measuring devices 12a, 12b of the subsystems 6a, 6b. The phase comparator 28a, 28b is connected to the resonant coupling circuit 22 via a communication channel 30 for transmitting a phase of the measuring signal voltage $U_m$.

In cooperation with the respective differential current measuring device 12a, 12b and a switching device 14a, 14b for separating the subsystem 6a, 6b, the subsystem 6a, 6b that is affected by the second fault can be specifically disconnected under evaluation of the information gathered by the phase comparator 28a, 28b.

In FIG. 3, a simplified illustration of the IT power supply system 2 is shown for the state of a second fault in a subsystem 6a or 6b, visible from the fault resistance $R_f$. The IT power supply system 2 is monitored by the electrical protective device 20 according to the invention, which is realized as a resonant coupling circuit 22.

For the measuring-frequency fault current, i.e. in the resonant case, the series resonant circuit 26 represents a low-resistance true resistance as compared to the insulation resistances prevalent in the non-faulty parts of the IT power supply system 2, so that the fault current driven by the measuring voltage $U_m$ can form a closed circuit via the (fault) resistance $R_f$ and the resonant coupling circuit 22.

As a numerical example, without taking into account the system leakage capacitances and the insulation fault, a selected capacitance $C_{AK}$ of 4.8 nF and an inductivity of 10 H results in a value of 730.7 Hz for the resonant frequency $f_{0AK}$ of the series resonant circuit. If the ohmic resistance $R_{AK}$ is set to 100 ohms, then the quality factor of this narrow-band series resonant circuit is Q=456.

The invention claimed is:

1. An electrical protective device (20) for selecting disconnection of a subsystem (6a, 6b) in an event of a second fault in an ungrounded power supply system (2) that consists of a main system (4) and at least one subsystem (6a, 6b), the subsystem (6a, 6b) having a differential current measuring device (12a, 12b) and a switching device (14a, 14b) for separating the subsystem (6a, 6b), the electrical protective device (20) comprising a resonant coupling circuit (22) that is connected against a ground (9) from one or more phase(s) of the main system (4) or from a neutral point of the main system (4) and has a measuring signal generator (24) for generating a measuring signal voltage ($U_m$) that has a measuring frequency signal and a series resonant circuit (26) that is connected in series to the measuring signal generator (24) and has a capacitance ($C_{AK}$), an inductivity ($L_{AK}$) and an ohmic resistance ($R_{AK}$).

2. The electrical protective device (20) according to claim 1, characterized in that the capacitance ($C_{AK}$) and the inductivity ($L_{AK}$) of the series resonant circuit (26) are realized in such a manner that a resonant frequency ($f_{0AK}$) of the series resonant circuit (26) corresponds to the measuring signal frequency of the measuring signal voltage ($U_m$).

3. The electrical protective device (20) according to claim 1, characterized in that the capacitance ($C_{AK}$) and the inductivity ($L_{AK}$) of the series resonant circuit (26) are realized in such a manner that the resonant frequency ($f_{0AK}$) of the series resonant circuit (26) is sufficiently different from an insulation resistance measuring frequency of an insulation monitoring device (16) that is arranged in the power supply system (2) and sufficiently different from a supply frequency of the power supply system (2).

4. The electrical protective device (20) according to claim 1, characterized in that the capacitance ($C_{AK}$) of the series resonant circuit (26) is several times smaller than the sum of the system leakage capacitances ($C_e$) present in the power supply system (2).

5. The electrical protective device (20) according to claim 1, characterized in that the ohmic resistance ($R_{AK}$) of the series resonant circuit (26) is realized in such a manner that it is low enough for the resonant coupling circuit (22) to approximately have a characteristic of an ideal voltage source.

6. The electrical protective device (20) according to claim 1, characterized in that the resonant coupling circuit (22) has a control circuit that changes the measuring signal frequency in such a manner that an amplitude of a measuring current that is driven by the measuring signal voltage ($U_m$) is at a maximum.

7. The electrical protective device (20) according to claim 1, characterized by a phase comparator (28a, 28b) that is associated with the differential current measuring device (12a, 12b) of the subsystem (6a, 6b) and ascertains a phase of a differential current registered in the differential current measuring device (12a, 12b) in relation to a phase of the measuring signal voltage ($U_m$).

8. The electrical protective device (20) according to claim 7, characterized by a communication channel (30) between the resonant coupling circuit (22) and the phase comparator (28a, 28b) for transmitting the phase of the measuring signal voltage ($U_m$).

9. The electrical protective device (20) according to claim 1, characterized in that a secondary coil of a differential current transformer of the differential current measuring device (12a, 12b) is terminated with a capacitive burden impedance so that in connection with the differential current transformer, which is realized as a Rogowski coil, a parallel resonant circuit is realized that is tuned to the resonant frequency ($f_{0AK}$) of the series resonant circuit (26).

10. The electrical protective device (20) according to claim 1, characterized by a separating device for separating the subsystem as a functional component of the electrical protective device.

11. A method for selecting disconnection of a subsystem (6a, 6b) in an event of a second fault in an ungrounded power supply system (2) that consists of a main system (4) and at least one subsystem (6a, 6b), the subsystem (6a, 6b) having a differential current measuring device (12a, 12b) and a switching device (14a, 14b) for separating the subsystem (6a, 6b), the method steps comprising of:
generating the measuring voltage signal ($U_m$) that has a measuring frequency signal,
applying the measuring voltage signal ($U_m$) between one or more phase(s) of the main system (4) or from a neutral point of the main system (4) against a ground (9) by means of a resonant coupling circuit (22) that has a measuring signal generator (24) and a series resonant circuit (26) that is connected in series to the measuring signal generator (24), wherein
a resonant frequency ($f_{0AK}$) of the series resonant circuit (26) is set in such a manner that it corresponds to the measuring signal frequency.

12. The method according to claim 11, characterized in that the resonant frequency ($f_{0AK}$) of the series resonant circuit (26) is set in such a manner that it is sufficiently different from an insulation resistance measuring signal frequency of an insulation monitoring device (16) that is arranged in the power supply system (2) and sufficiently different from a supply frequency of the power supply system (2).

13. The method according to claim 11, characterized in that by means of control, the measuring signal frequency is changed in such a manner that an amplitude of a measuring current that is driven by the measuring signal voltage ($U_m$) reaches a maximum.

14. The method according to claim 11, characterized in that performing a phase comparison in which a phase of a differential current to be registered in the differential current measuring device (12a, 12b) is ascertained in relation to a phase of the measuring voltage signal ($U_m$).

15. The method according to claim 14, characterized in that transmitting by the resonant coupling circuit (22) the phase of the measuring voltage signal direct ($U_m$) to a phase comparator (28a, 28b).

\* \* \* \* \*